(12) United States Patent
Huang

(10) Patent No.: US 11,770,062 B2
(45) Date of Patent: Sep. 26, 2023

(54) LIQUID HEAT EXCHANGER FOR ELECTRONIC DEVICE

(71) Applicant: Apple Inc., Cupertino, CA (US)

(72) Inventor: Xiaoyi Huang, Union City, CA (US)

(73) Assignee: Apple Inc., Cupertino, CA (US)

( * ) Notice: Subject to any disclaimer, the term of this patent is extended or adjusted under 35 U.S.C. 154(b) by 319 days.

(21) Appl. No.: 16/988,558

(22) Filed: Aug. 7, 2020

(65) Prior Publication Data
US 2022/0045592 A1    Feb. 10, 2022

(51) Int. Cl.
| H02K 44/00 | (2006.01) |
| F04D 13/02 | (2006.01) |
| H02K 44/04 | (2006.01) |
| H02K 44/08 | (2006.01) |
| H05K 7/20  | (2006.01) |

(52) U.S. Cl.
CPC .......... *H02K 44/04* (2013.01); *H02K 44/085* (2013.01); *H05K 7/20272* (2013.01); *F04D 13/027* (2013.01)

(58) Field of Classification Search
None
See application file for complete search history.

(56) References Cited

U.S. PATENT DOCUMENTS

| 7,061,148 | B2 | 6/2006 | Philippart | |
| 7,798,783 | B2* | 9/2010 | Burns | F04B 7/06 |
| | | | | 417/415 |
| 8,800,527 | B2 | 8/2014 | McAlister | |
| 8,820,093 | B2 | 9/2014 | Heitzler et al. | |
| 9,546,803 | B2* | 1/2017 | Watanabe | F25B 21/00 |
| 9,894,802 | B2* | 2/2018 | Loewen | H05K 1/0272 |
| 10,541,081 | B2* | 1/2020 | Handy | H02M 1/126 |
| 10,645,844 | B2* | 5/2020 | Dariavach | H05K 7/20272 |
| 11,054,193 | B2* | 7/2021 | Flowers | F16F 9/10 |
| 2009/0279257 | A1* | 11/2009 | Lower | H05K 1/0272 |
| | | | | 361/699 |
| 2011/0286868 | A1* | 11/2011 | Sardet | F04B 17/046 |
| | | | | 417/417 |
| 2017/0104426 | A1* | 4/2017 | Mills | C25B 1/04 |
| 2022/0080427 | A1* | 3/2022 | Crockett | B01L 3/502707 |
| 2022/0274124 | A1* | 9/2022 | Foury | B05B 12/1481 |

* cited by examiner

*Primary Examiner* — Courtney L Smith
(74) *Attorney, Agent, or Firm* — Kubota & Basol LLP

(57) ABSTRACT

In some examples, a system can include an electronic device and a cooling system that transfers heat among other components of the system. The cooling system can include a pipe that contains a fluid, for example. In some examples, the cooling system can further include a magnetic piston, one or more electromagnetic coils, and a power supply. The electromagnetic coils and power supply can generate a magnetic field that moves the piston to cause the fluid to circulate in the fluid pipe. In some examples, the cooling system can further include a magnet and one or more pairs of electrodes coupled to a power supply. The magnet, electrodes, and power supply can generate a Lorentz force that causes a conductive fluid to circulate in the fluid pipe.

17 Claims, 4 Drawing Sheets

LIQUID HEAT EXCHANGER FOR ELECTRONIC DEVICE

FIELD OF THE DISCLOSURE

This relates generally to a heat exchanger and, more particularly, to a heat exchanger that uses a magnet to circulate cooling fluid.

BACKGROUND OF THE DISCLOSURE

Components of an electronic device can generate heat while in use. The elevated temperature of the components of the electronic device can be uncomfortable or harmful to a user in close proximity or contact with to the components and/or electronic device. Additionally, the elevated temperature of the electronic device can impact the performance, damage components and/or decrease the longevity of the electronic device.

BRIEF SUMMARY OF THE DISCLOSURE

This disclosure relates generally to a heat exchanger and, more particularly, to a heat exchanger that uses a magnet to circulate cooling fluid. In some examples, a system can include an electronic device and a cooling system configured to transfer heat from one component of the electronic device that can generate heat to a housing of the system (e.g., a housing of the electronic device). In some examples, the cooling system can include a magnetic piston within a piston housing of the cooling system. The piston housing can be fluidly coupled to a pipe containing a fluid, such as water, for example. In some examples, the cooling system can further include one or more electromagnetic coils coupled to a power supply (e.g., an AC power supply) that are configured to generate a magnetic field. The magnetic piston can move back and forth within the piston housing to cause the liquid to circulate in the fluid pipe, for examples. In some examples, the moving fluid can transfer heat between components of the system.

In some examples, the cooling system can include a magnet and one or more pairs of electrodes coupled to a power supply (e.g., a DC power supply) coupled to or in proximity to one or more pipes containing a conductive cooling fluid. The magnet, electrodes, and power supply can generate a Lorentz force that can cause the conductive cooling fluid to circulate within the fluid pipe. In some examples, the circulating fluid can transfer heat between components of the system.

DETAILED DESCRIPTION OF THE DISCLOSURE

In the following description of examples, reference is made to the accompanying drawings which form a part hereof, and in which it is shown by way of illustration specific examples that can be practiced. It is to be understood that other examples can be used and structural changes can be made without departing from the scope of the disclosed examples.

This disclosure relates generally to a heat exchanger and, more particularly, to a heat exchanger that uses a magnet to circulate cooling fluid. In some examples, a system can include an electronic device and a cooling system configured to transfer heat from one component of the electronic device that can generate heat to a housing of the system (e.g., a housing of the electronic device). In some examples, the cooling system can include a magnetic piston within a piston housing of the cooling system. The piston housing can be fluidly coupled to a pipe containing a fluid, such as water, for example. In some examples, the cooling system can further include one or more electromagnetic coils coupled to a power supply (e.g., an AC power supply) that are configured to generate a magnetic field. The magnetic piston can move back and forth within the piston housing to cause the liquid to circulate in the fluid pipe, for examples. In some examples, the moving fluid can transfer heat between components of the system.

In some examples, the cooling system can include a magnet and one or more pairs of electrodes coupled to a power supply (e.g., a DC power supply) coupled to or in proximity to one or more pipes containing a conductive cooling fluid. The magnet, electrodes, and power supply can generate a Lorentz force that can cause the conductive cooling fluid to circulate within the fluid pipe. In some examples, the circulating fluid can transfer heat between components of the system.

Figure 1A:
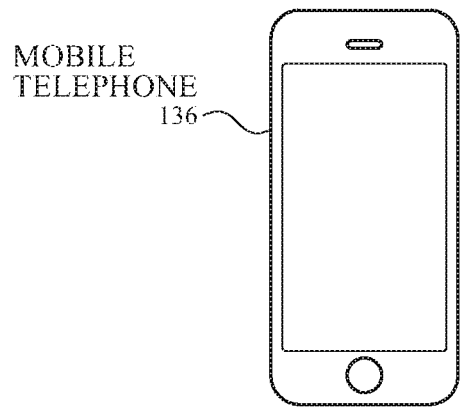
FIGS. 1A-1E illustrate example systems that can use liquid heat exchanger techniques according to some examples of the disclosure.
Figure 1B:
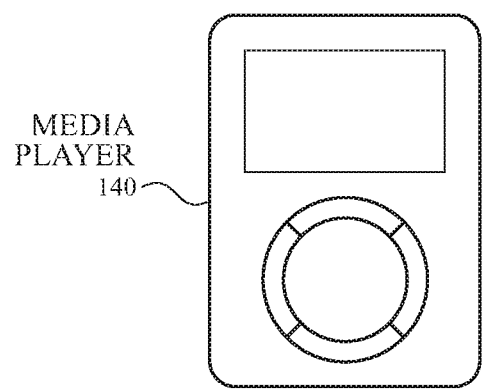
Figure 1C:
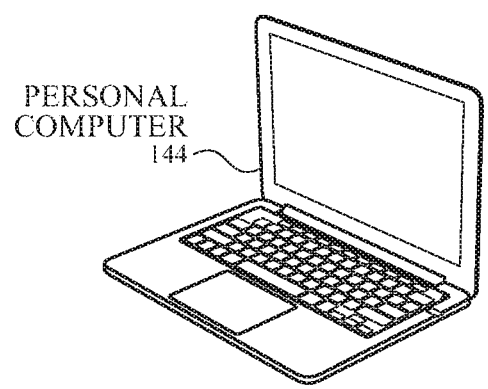
Figure 1D:
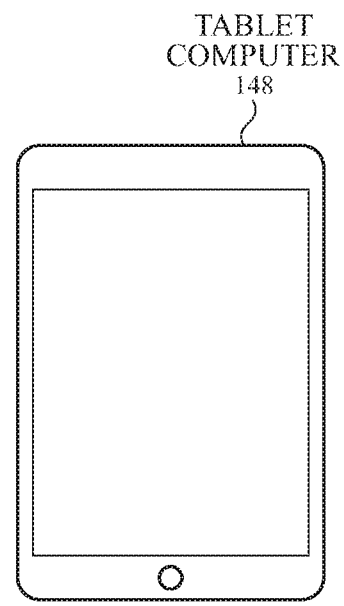
Figure 1E:
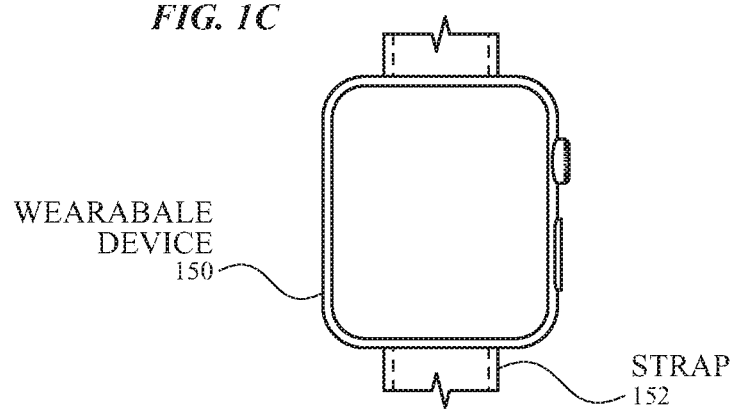

FIGS. 1A-1E illustrate example systems that can use liquid heat exchanger techniques according to some examples of the disclosure. FIG. 1A illustrates an example mobile telephone 136 that can use liquid heat exchanger techniques according to examples of the disclosure. FIG. 1B illustrates an example digital media player 140 that can use liquid heat exchanger techniques according to examples of the disclosure. FIG. 1C illustrates an example personal computer 144 that can use liquid heat exchanger techniques according to examples of the disclosure. FIG. 1D illustrates an example tablet computing device 148 that can use liquid heat exchanger techniques according to examples of the disclosure. FIG. 1E illustrates an example wearable device 150 that includes a strap 152 that can use liquid heat exchanger techniques according to examples of the disclosure. It is understood that liquid heat exchanger techniques can be implemented in other devices (e.g., desktop computers, head-mounted devices, projectors, gaming consoles, external storage devices, servers), including future devices not yet in the marketplace.

In some examples, one or more of devices 135, 140, 144, 148, and 150 or other devices can incorporate a cooling system. For example, an electronic device can include one or more fans within or coupled to the housing of the electronic device. In some examples, fans can circulate warm air from areas of the electronic device proximate to heat-generating components to areas where less heat is generated and/or to a relatively cooler environment to reduce the temperature of the heat-generating component. Reducing the temperature of the heat-generating component can improve the user experience, prevent injury to a user, prevent damage to components and promote longevity of the electronic device. Moreover, in some examples, fans can have a compact design that does not add an unacceptable amount of bulk to the electronic device (e.g., less than a threshold weight/size) and can be designed to achieve sufficient cooling (e.g., a threshold amount of heat exchange/dissipation) without requiring an unacceptable amount of power (e.g., less than a threshold amount power consumption). However, in some examples, fans can be undesirable due to the noise and vibration that they generate, especially for electronic devices such as mobile devices and wearable devices that can be used in close proximity to the user. Therefore, in some examples, it can be desirable to incorporate a cooling system that provides sufficient cooling with acceptable size and power requirements that does not generate the noise and vibration generated by a fan. In some examples, liquid heat exchanger techniques disclosed herein can achieve these objectives.

Although not shown in FIGS. 1A-1E, it should be understood that a cooling system that uses the liquid heat exchanger techniques disclosed herein can be incorporated into or coupled to the housing of one or more of the devices 136, 140, 144, 148, and 150, for example. In some examples, integrating the cooling system with the housing or coupling the cooling system with the housing can enable the cooling system to absorb heat from one or more components (e.g., processors, memory, displays, etc.) that generate heat during operation and release heat to one or more components (e.g., a heat sink, a portion of the electronic device's housing configured to absorb heat and dissipate heat). In some examples, the housing can be partially or fully formed from a material with relatively high thermal conductivity to improve efficiency of the cooling functionality. In some examples, transferring the heat in this way can facilitate cooling the electronic device and improve the user experience, device performance, and/or device longevity.

Figure 2:
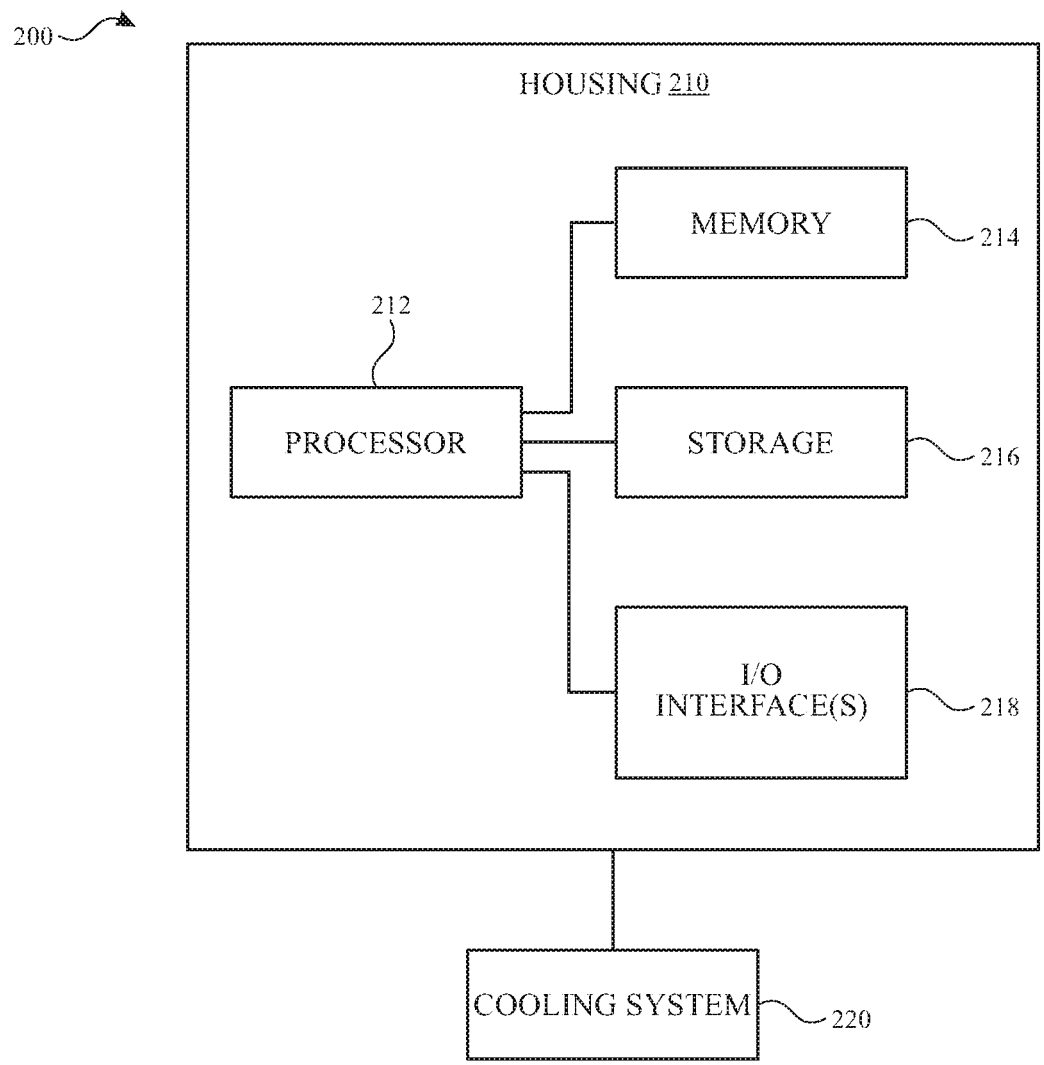
FIG. 2 illustrates an exemplary system that can include a cooling system according to some examples of the disclosure.

FIG. 2 illustrates an exemplary system 200 that can include a cooling system 220 according to some examples of the disclosure. In some examples, system 200 includes or is included in an electronic device, such as one or more of the electronic devices described above with reference to FIGS. 1A-1E or another electronic device. For example, an electronic device can include all of the components of system 200. As another example, one or more components of system 200 can be included in an electronic device.

In some examples, system 200 can include a housing 210 in which a processor 212, memory 214, storage 216, and I/O interface(s) 218 can be disposed. The housing 210 can be coupled to a cooling system 220 in some examples. In some examples, the cooling system 220 can be disposed within housing 210 or integrated with housing 210. Housing 210 can include materials such as metal (e.g., aluminum, steel, titanium, etc.) and/or plastic, for example. In some examples, housing 210 can seal the components disposed within the housing (e.g., processor 212, memory 214, storage 216, I/O interface(s) 218) from an environment external to the housing, including preventing water, dust, and other matter from entering the housing from the environment external to the housing.

In some examples, the housing 210 can be configured to absorb heat transferred from one of the components (e.g., processor 212, memory 214, storage 216, and/or I/O interface(s) 218) of system 200 by the cooling system 220. In this way, in some examples, the temperature of the component that is generating heat can be reduced by the cooling system 220. In some examples, one or more properties of the housing 210 can facilitate cooling of the housing 210 by transferring the heat from the cooling system 220 to the environment external to the housing. For example, an external surface of the housing 210 may transfer heat to the environment external to the housing more readily than the components within the housing (e.g., processor 212, memory 214, storage 216, and/or I/O interface(s) 218) because the external surface of the housing 210 can be exposed to circulating air and can have a larger surface area than the component(s), while the components within the housing can be insulated from the circulating air (e.g., by housing 210).

In some examples, system 200 can include one or more additional components not illustrated in FIG. 2. For example, the system 200 can include, or can be in communication with, one or more input devices (e.g., touch sensitive surface, keyboard, mouse, motion/image sensors, etc.) and/or one or more output devices (e.g., display devices, speakers, tactile output devices, etc.) in communication with I/O interface(s) 218. It should be understood that the arrangement of the components of system 200 in FIG. 2 is merely exemplary and, in some examples, a system incorporating liquid heat exchange techniques disclosed herein can include a different arrangement of components and/or exclude one or more of the components illustrated in FIG. 2. Examples of cooling systems 220 that can be included in the system 200 are described below with reference to FIGS. 3A-4B.

Figure 3A:
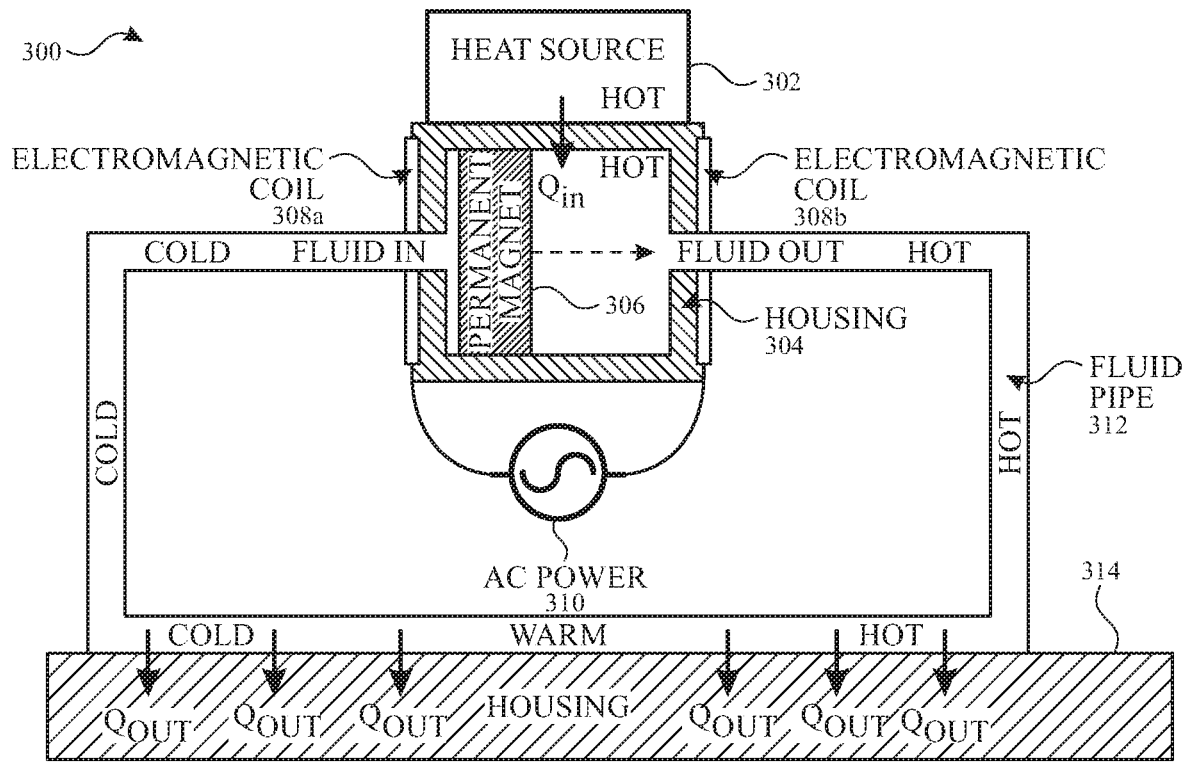
FIGS. 3A-3B illustrate an exemplary cooling system including a magnetic piston according to some examples of the disclosure.
Figure 3B:
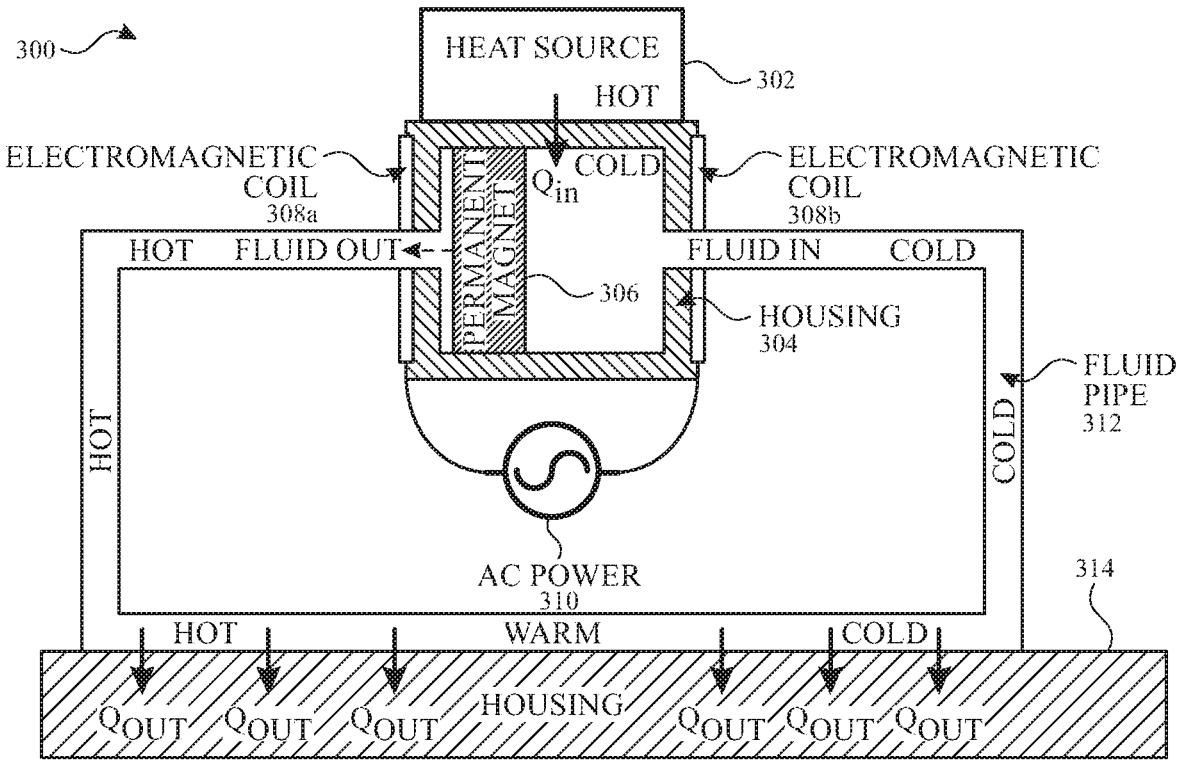

FIGS. 3A-3B illustrate an exemplary cooling system 300 including a magnetic piston 306 according to some examples of the disclosure. In some examples, cooling system 300 can be included in system 200 described above with reference to FIG. 2 (e.g., in place of cooling system 220) and can be included in, coupled to, or otherwise used with one or more of the electronic devices described above with reference to FIGS. 1A-1E. In some examples, the cooling system 300 can be configured to transfer heat from a heat source 302 to a portion of a housing 314 of a system incorporating the cooling system 300 (e.g., system 200). Heat source 302 can be one of the components of system 200 included in housing 210 or another component of an electronic device, for example.

In some examples, cooling system 300 can include magnetic piston 306 located within a piston housing 304, a fluid pipe 312 containing a cooling fluid, electromagnetic coils 308a and 308b, and AC power supply 310. Magnetic piston 306 can include a permanent magnet (e.g., strong rare earth magnet), for example. In some examples, the cooling fluid can be water, a refrigerant such as Freon, or another liquid or fluid. Electromagnetic coils 308a and 308b can include a plurality of loops or turns, which can be situated around the exterior of the fluid pipe 312 on either side of the piston housing 304, for example. In some examples, cooling system 300 includes a single electromagnetic coil at the location of one of the electromagnetic coils 308a and 308b illustrated in FIGS. 3A-3B.

In some examples, piston housing 304 can be in contact with or located proximate to heat source 302. In some examples, a section of the fluid pipe 312 opposite from the piston housing 304 can be in contact with or proximate to a portion of the housing 314 of the system (e.g., housing 210 of system 200) including cooling system 300 (e.g., in place of cooling system 220). In some examples, instead of the arrangement illustrated in FIGS. 3A-3B, housing 314 can be in contact with or proximate to piston housing 304 and heat source 302 can be in contact with or proximate to the section of the fluid pipe 312 opposite from the piston housing 304. Magnetic piston 306 can pump the cooling fluid within fluid pipe 312 in alternating directions to transfer heat from the heat source 302 to housing 314, for example. In some examples, the magnetic piston 306 can be sized to have the same cross-section as the piston housing 304 (e.g., in the dimensions other than the dimension along which the magnetic piston 306 moves to move the fluid). An O-ring can be disposed around magnetic piston 306, for example, to prevent the magnetic piston 306 from rotating and/or to seal the piston to the piston housing 304. In some examples, sealing the magnetic piston 306 to the piston housing 304 can prevent or reduce flow of fluid between the magnetic piston and the piston housing, which can improve the transfer of kinetic energy between the magnetic piston and the fluid. In some examples, the width of the magnetic piston can be selected to prevent turning instead of or in addition to incorporating an O-ring.

In some examples, the electromagnetic coils 308a-b can generate magnetic fields to cause the magnetic piston 306 to move back and forth within piston housing 304. The electromagnetic coils 308a-308b can be coupled to opposite sides of the piston housing 304 and can be further coupled to AC power supply 310, for example. In some examples, the AC power supply 310 can generate an alternating current in each of the electromagnetic coils 308a-b, which can, in turn, generate the alternating magnetic fields. In some examples, the current can be supplied to both electromagnetic coils 308a-b simultaneously. In some examples, the current can be supplied to one electromagnetic coil 308a or 308b at a time on an alternating basis.

In some examples, cooling system 300 can include a temperature sensor (not shown) that can sense the temperature of the cooling system 300 (e.g., the temperature of heat source 302 or another location of cooling system 300). A processor or other device in communication with the AC power supply 310 can modify the frequency and/or amplitude of the AC power supply in accordance with the temperature of the cooling system 300 to adjust the frequency at which the magnetic piston 306 oscillates based on the current temperature of the system, for example. In turn, in some examples, the system 300 is able to adjust the speed at which the cooling fluid moves within fluid pipe 312 and/or the frequency with which the fluid changes direction within fluid pipe 312. In some examples, increasing the frequency and/or amplitude of AC power supply 310 can transfer more heat from heat source 302 to housing 314. In some examples, decreasing the frequency and amplitude of the AC power supply 310 can reduce the rate of cooling and conserve power. Thus, in some examples, it can be advantageous to adjust the frequency and amplitude of the AC power supply 310 in accordance with the temperature of system 300 to balance the tradeoff between power consumption and performance.

FIGS. 3A and 3B illustrate the cooling system 300 in two different states, for example. FIGS. 3A and 3B include the labels "hot", "cold", and "warm" to indicate the relative temperatures of the fluid at various locations within fluid pipe 312 in each state. In FIG. 3A, the magnetic piston 306 can move to the right, while in FIG. 3B, the magnetic piston 306 can move to the left, for example. In some examples, the direction of the current supplied by AC power supply 310 can be a first direction in FIG. 3A and can be a second direction opposite the first direction in FIG. 3B. Thus, in some examples, the direction of the magnetic field can be a first direction in FIG. 3A and can be a second direction opposite the first direction in FIG. 3B.

In FIG. 3A, the magnetic piston 306 can begin to move to the right from a location on the left side of the piston housing 304, for example. In FIG. 3A, in some examples, the movement of the magnetic piston 306 to the right can cause the cooling fluid within fluid pipe 312 to circulate in a clockwise direction. In some examples, in FIG. 3A, the fluid within piston housing 304 can be relatively hot from exposure to the heat from heat source 302. For example, the fluid on the right side of fluid pipe 312 that has not yet flowed past the housing 314 can be relatively hot. In some examples, the fluid towards the middle of the section of fluid pipe 312 in contact with or proximate to housing 314 can be less hot than the fluid on the right side of the fluid pipe. As another example, the fluid located within the left side of the fluid pipe 312 that has flowed past the housing 314 can be at a lower temperature than the fluid towards the middle of the section of fluid pipe 312 in contact with or proximate to housing 314. In some examples, after flowing around the fluid pipe 312, the fluid can cool down to a relatively cold temperature before returning to piston housing 304. In some examples, the movement of the magnetic piston illustrated in FIG. 3A can push the relatively hot fluid in the piston housing 304 out from the right opening of the piston housing 304 and pull the relatively cold fluid from the left opening of the piston housing 304 into the piston housing 304. In some examples, the relatively cold fluid can absorb heat from heat source 302 before moving through fluid pipe 312 towards housing 314.

In FIG. 3B, the magnetic piston 306 can finish moving to the left as it reaches a location on the left side of piston housing 304, for example. In FIG. 3B, in some examples, the movement of the magnetic piston 306 to the left can cause the cooling fluid within fluid pipe 312 to circulate in a counterclockwise direction. In some examples, in FIG. 3B, the fluid within piston housing 304 can be relatively cold from having moved past the housing 314 while circulating around fluid pipe 312. For example, the fluid on the right side of fluid pipe 312 that has not yet flowed into piston housing 304 can be relatively cold. In some examples, the fluid towards the middle of the section of fluid pipe 312 in contact with or proximate to housing 314 can be warmer than the fluid on the right side of the fluid pipe. As another example, the fluid located within the left side of the fluid pipe 312 that has not yet flowed past the housing 314 after exiting piston housing 304 can be warmer than the fluid towards the middle of the section of fluid pipe 312 in contact with or proximate to housing 314. In some examples, movement of the magnetic piston 306 can pump hot fluid out of piston housing 304 and pump relatively cold fluid into the piston housing 304. In some examples, the movement of the magnetic piston illustrated in FIG. 3B can push the relatively hot fluid in the piston housing 304 out from the left opening of the piston housing 304 and pull the relatively cold fluid from the right opening of the piston housing 304 into the piston housing 304.

Figure 4A:
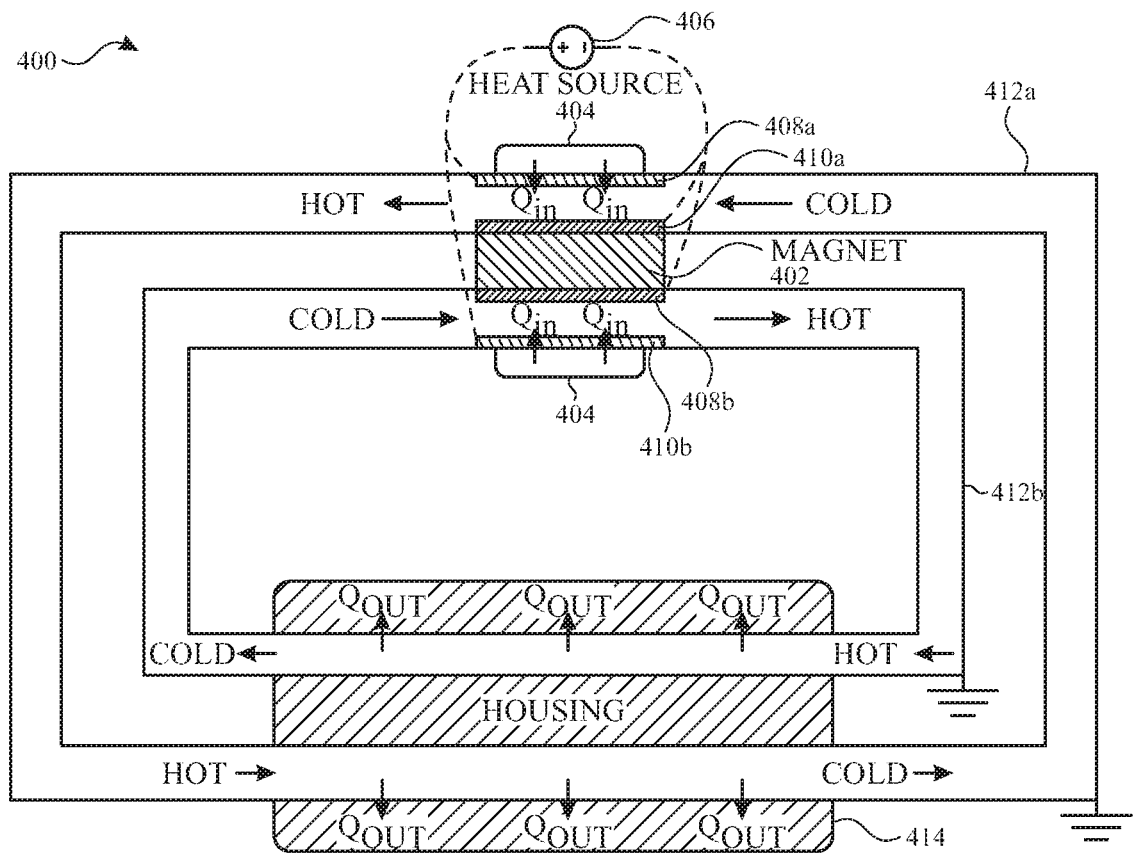
FIG. 4A illustrates an exemplary cooling system that utilizes Lorentz force to circulate a conductive cooling fluid according to some examples of the disclosure.

FIG. 4A illustrates an exemplary cooling system that utilizes Lorentz force to circulate a conductive cooling fluid according to some examples of the disclosure. In some examples, cooling system 400 can be included in system 200 described above with reference to FIG. 2 (e.g., in place of cooling system 220) and can be included in, coupled to, or otherwise used with one or more of the electronic devices described above with reference to FIGS. 1A-1E. In some examples, the cooling system 400 can be configured to transfer heat from a heat source 404 to a portion of a housing 414 of a system incorporating the cooling system 400 (e.g., system 200). Heat source 404 can be one of the components of system 200 included in housing 210 or another component of an electronic device, for example.

In some examples, cooling system 400 can include magnet 402, electrodes 408a-b and 410a-b coupled to power supply 406, and fluid pipes 412a-b. The fluid pipes 412a-b can be in contact with or proximate to (e.g., within a threshold distance of) a heat source 404 and at least a portion of the housing 414 of a system (e.g., system 200) that utilizes the cooling system 400, for example. In some examples, fluid pipes 412a and 412b can contain a conductive cooling fluid, such as a ferrofluid (e.g., ferromagnetic fluids) or mixture of a liquid (e.g., water, refrigerant, etc.) and conductive particles (e.g., metallic filings or other particles). In some examples, the concentration of conductive particles within the fluid can be selected to balance the tradeoff between increased conductivity by increasing the concentration of conductive particles and decreased viscosity by decreasing the concentration of conductive particles. In some examples, an increased concentration of conductive particles and increased conductivity can enable the system 400 to increase the current through the conductive fluid. In some examples, a decreased concentration of conductive particles and decreased viscosity can enable movement of the conductive fluid with a weaker current, which can save power. In some examples, the conductive cooling fluid can be circulated using a Lorentz force generated by electrodes 408a-b and 410a-b, power supply 406, and magnet 402.

Figure 4B:
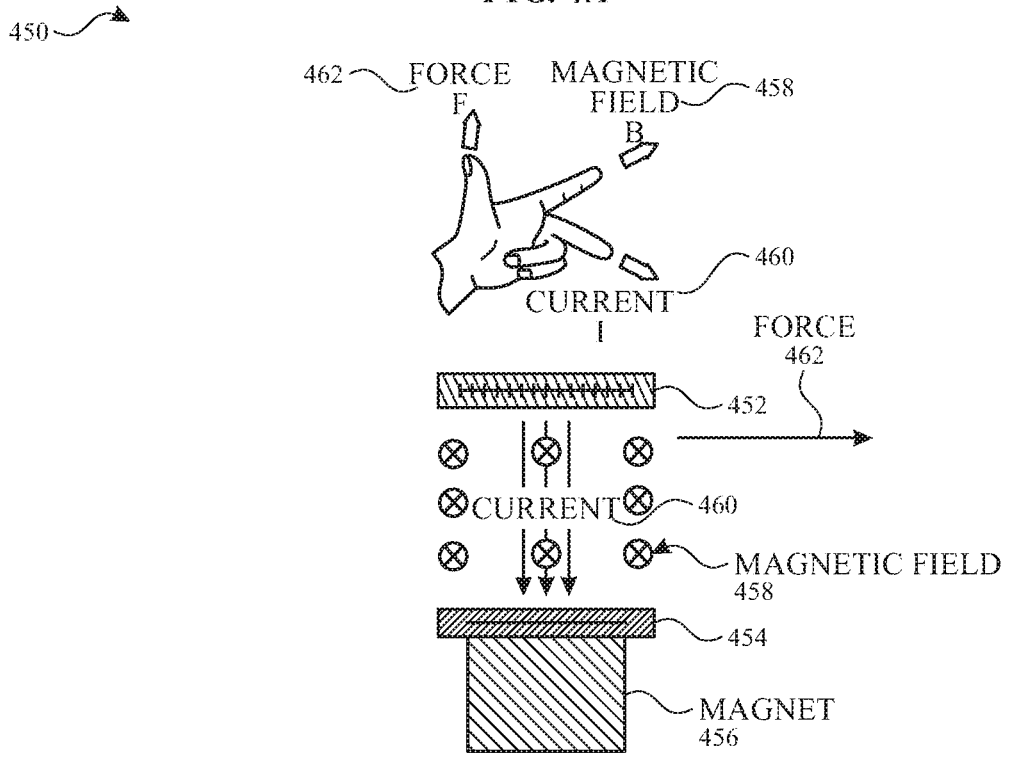
FIG. 4B illustrates an exemplary Lorentz force generated by a current and magnetic field according to some examples of the disclosure.

FIG. 4B illustrates an exemplary Lorentz force 462 generated by a current 460 and magnetic field 458 according to some examples of the disclosure. In some examples, components of a magnetic field 458 and an electrical current 460 that are normal to one another can produce a Lorentz force 462 in the directions illustrated in FIG. 4B. For example, according to the left hand rule, a magnetic field 458 in the direction aligned with the exemplary index finger illustrated in FIG. 4B and an electrical current 460 in the direction aligned with the exemplary middle finger illustrated in FIG. 4B can produce a Lorentz force 462 in the direction aligned with the exemplary thumb illustrated in FIG. 4B. As another example, a magnetic field 458 in the direction into the Figure (e.g., generated by magnet 456) and a downward electrical current 460 (e.g., generated by electrodes 452 and 454) can generate a Lorentz force 462 to the left, for example. In some examples, the Lorentz force 462 can act on charged particles to cause them to accelerate under the force.

Returning to FIG. 4A, electrodes 408a-b and 410a-b coupled to power supply 406 and magnet 402 can generate a Lorentz force that acts on the conductive fluid in fluid pipes 412a-b to cause the fluid to circulate in the fluid pipes 412a-b, for example. In some examples, the conductive fluid in fluid pipe 412a can carry the current from electrode 408a to electrode 410a and the conductive fluid in fluid pipe 412b can carry the current from electrode 408b to electrode 410b. Thus, for example, electrodes 408a and 410a can generate an electrical current through the conductive fluid in fluid pipe 412a in a downward direction and electrodes 408b and 410b can generate an electrical current through the conductive fluid in fluid pipe 412b in an upward direction. In some examples, magnet 402 can generate a magnetic field in a direction into the Figure. The electrical current through the conductive fluid in fluid pipe 412a and the magnetic field can generate a Lorentz force towards the left that can cause the conductive fluid in fluid pipe 412a to circulate the fluid pipe 412a in a counterclockwise direction, for example. Likewise, for example, the electrical current through the conductive fluid in fluid pipe 412b and the magnetic field can generate a Lorentz force towards the right that can cause the conductive fluid in fluid pipe 412b to circulate the fluid pipe 412b in a clockwise direction.

In some examples, the direction of the magnetic field can be reversed and the directions of fluid flow in the fluid pipes 412a and 412b can be reversed. In some examples, rather than circulating in opposite directions, the fluid can flow through fluid pipes 412a and 412b in the same direction. For example, reversing the direction of the current through one of the fluid pipes 412a or 412b can cause both currents to move in the same direction, which, as long as the magnetic field acting on both fluid pipes is in the same direction, can cause the Lorentz force acting on the fluid in both fluid pipes 412a and 412b to act in the same direction.

In some examples, fluid pipes 412a and 412b can include an electrically conductive material. Electrically conductive materials can facilitate conduction of heat and can improve the performance of the cooling system 400, for example. In some examples, fluid pipes 412a and 412b including the electrically conductive material can be coupled to a reference voltage (e.g., a virtual ground or other reference voltage of the electronic device included in the system 200 including cooling system 400) or ground to reduce the chance of electrical shock. In some examples, fluid pipes 412a and 412b include materials that are poor electrical conductors and the connections to ground may be eliminated.

In some examples, the circulation of the conductive fluid can facilitate heat exchange between the heat source 404 and the portion of the housing 414. Conductive fluid that is close to the heat source 404 can absorb heat from the heat source 404 and conductive fluid that is close to housing 414 can transfer heat to the housing 414, for example. In some examples, circulating the fluid using the Lorentz force described above can continuously bring cold or cool fluid towards heat source 404 and bring hot or warm fluid towards housing 414 to transfer heat from the heat source 404 to the housing 414. FIG. 4A includes the labels "hot" and "cold" to indicate relative temperatures of the fluid at various locations along fluid pipes 412a and 412b, as described below.

For example, the conductive cooling fluid contained in fluid pipe 412a can circulate in a counterclockwise direction, as described above. In some examples, fluid that just moved past heat source 404 (e.g., illustrated as being to the left of heat source 404) can be hot from absorbing the heat from heat source 404. Once the fluid reaches a location of fluid pipe 412a that is next to the housing 414, heat can be transferred from the fluid (e.g., through fluid pipe 412a) into housing 414, for example. In some examples, the fluid that just moved past the housing 414 (e.g., illustrated as being to the right of housing 414) can be relatively cold. The cold fluid can continue to move through fluid pipe 412a back to a location proximate to the heat source 404, for example, and the cold fluid can absorb heat from the heat source 404 again and the cooling process can continue.

As another example, the conductive cooling fluid contained in fluid pipe 412b can circulate in a clockwise direction, as described above. In some examples, fluid that just moved past heat source 404 (e.g., illustrated as being to the right of heat source 404) can be hot from absorbing the heat from heat source 404. Once the fluid reaches a location of fluid pipe 412b that is next to the housing 414, heat can be transferred from the fluid (e.g., through fluid pipe 412a) into housing 414, for example. In some examples, the fluid that just moved past the housing 414 (e.g., illustrated as being to the left of housing 414) can be cool. The cool fluid can continue to move through fluid pipe 412a back to a location proximate to the heat source 404, for example, and the cold fluid can absorb heat from the heat source 404 again and the cooling process can continue.

In some examples, the power supply 406 can output a variable voltage, such as by using pulse width modulation, to conserve power. For example, the cooling system 400 can include a temperature sensor (not shown) that can be used to adjust the output of power supply 406 which, in turn, can adjust the electrical current provided by electrodes 408*a-b* and 410*a-b* through the conductive fluid. Thus, in some examples, the rate at which the conductive fluid circulates can be adjusted to increase the cooling rate of system 400 when the temperature exceeds one or more thresholds and to decrease the cooling rate of system 400 when the temperature is less than the one or more thresholds. In this way, in some examples, the tradeoff between power consumption and performance can be adjusted in real-time as needed.

In some examples, as shown in FIG. 4A, the magnet 402 and electrodes 408*a-b* and 410*a-b* can be located proximate to the heat source 404. In some examples, the magnet 402 and electrodes 408*a-b* and 410*a-b* can be located proximate to housing 414 and the heat source 404 can be located at a location along fluid pipes 412*a* and 412*b* away from the housing 414. In some examples, the magnet 402 and electrodes 408*a-b* and 410*a-b* can be disposed at a location along fluid pipes 412*a* and 412*b* that is distinct from the locations of the heat source 404 and housing 414 along the fluid pipes 412*a* and 412*b*.

Therefore, according to the above, some examples of the disclosure are directed to a system comprising an electronic device, the electronic device including a housing and a first component; a cooling system, the cooling system comprising: a pipe containing a conductive fluid, wherein a first location of the pipe is thermally coupled to the housing of the electronic device and a second location of the pipe is thermally coupled to the first component of the electronic device; a magnet configured to generate a magnetic field at a third location of the pipe; and a power supply coupled to two electrodes, the power supply and the electrodes configured to generate an electrical current through the conductive fluid at the third location of the pipe, wherein the magnet, power supply, and electrodes are configured to create a Lorentz force that acts on the conductive fluid at the third location of the pipe. Additionally or alternatively, in some examples, the pipe includes an electrically conductive material coupled to a reference voltage. Additionally or alternatively, in some examples, the first component of the electronic device is located at the third location along the pipe. Additionally or alternatively, in some examples, the housing of the electronic device is located at the third location along the pipe. Additionally or alternatively, in some examples, the power supply is configured to supply a direct current (DC) voltage to the two electrodes. Additionally or alternatively, in some examples, the pipe is a first pipe and the electrodes are first electrodes, and the system further comprises a second pipe containing the conductive fluid, wherein a first location of the second pipe is thermally coupled to the housing of the electronic device and a second location of the second pipe is thermally coupled to the first component of the electronic device; two second electrodes coupled to the power supply, wherein the power supply and two second electrodes are configured to generate a second electrical current through the conductive fluid at a third location of the second pipe. Additionally or alternatively, in some examples, the first electrodes are configured to generate a current that creates a Lorentz force in a first direction, and the second electrodes are configured to generate a current that creates a Lorentz force in a second direction, opposite the first direction.

In some examples, a cooling system comprises a pipe containing a conductive fluid, wherein a first location of the pipe is thermally coupled to a housing of an electronic device and a second location of the pipe is thermally coupled to a first component of the electronic device; a magnet configured to generate a magnetic field at a third location of the pipe; and a power supply coupled to two electrodes, the power supply and the electrodes configured to generate an electrical current through the conductive fluid at the third location of the pipe, wherein the magnet, power supply, and electrodes are configured to create a Lorentz force that acts on the conductive fluid at the third location of the pipe. Additionally or alternatively, in some examples, the pipe includes an electrically conductive material coupled to a reference voltage. Additionally or alternatively, in some examples, the pipe is configured to couple to the first component of the electronic device at the third location along the pipe. Additionally or alternatively, in some examples, the pipe is configured to couple to the housing of the electronic device at the third location along the pipe. Additionally or alternatively, in some examples, the power supply is configured to supply a direct current (DC) voltage to the two electrodes. Additionally or alternatively, in some examples, the pipe is a first pipe and the electrodes are first electrodes, and the system further comprises: a second pipe containing the conductive fluid, wherein a first location of the second pipe is thermally coupled to the housing of the electronic device and a second location of the second pipe is thermally coupled to the first component of the electronic device; and two second electrodes coupled to the power supply, wherein the power supply and two second electrodes are configured to generate a second electrical current through the conductive fluid at a third location of the second pipe. Additionally or alternatively, in some examples, the first electrodes are configured to generate a current that creates a Lorentz force in a first direction, and the second electrodes are configured to generate a current that creates a Lorentz force in a second direction, opposite the first direction.

In some examples, a system comprises an electronic device, the electronic device including a housing and a first component; a cooling system, the cooling system comprising: a pipe containing a fluid; a piston housing coupled to the pipe; a magnetic piston disposed within the piston housing; a power supply; an electromagnetic coil coupled to a surface of the piston housing and coupled to the power supply, wherein the power supply and electromagnetic coil are configured to generate a variable magnetic field that causes motion of the piston in the piston housing. Additionally or alternatively, in some examples, the power supply is configured to generate an alternating current (AC) signal, the electromagnetic coil is configured to generate an alternating magnetic field, and the piston is configured to move in alternating directions and cause movement of the fluid in alternating directions in the fluid pipe. Additionally or alternatively, in some examples, the first component of the electronic device is thermally coupled to the piston housing of the cooling system. Additionally or alternatively, in some examples, the housing of the electronic device is thermally coupled to the piston housing of the cooling system. Additionally or alternatively, in some examples, the electromagnetic coil is a first electromagnetic coil, and the system further comprises: a second magnetic coil coupled to a surface of the piston housing that is opposite from the surface of the piston housing to which the first magnetic coil is coupled, the second magnetic coil being coupled to the power supply, wherein the second magnetic coil is configured to generate a second variable magnetic field that causes motion of the piston in the piston housing. Additionally or alternatively, in some examples, the first electromagnetic coil is configured to generate the variable magnetic field in a direction that is the same as a direction of the second magnetic field generated by the second electromagnetic coil.

Although the disclosed examples have been fully described with reference to the accompanying drawings, it is to be noted that various changes and modifications will become apparent to those skilled in the art. Such changes and modifications are to be understood as being included within the scope of the disclosed examples as defined by the appended claims.

The invention claimed is:

1. A system comprising:
   an electronic device, the electronic device including a housing and a first component;
   a cooling system, the cooling system comprising:
      a first pipe containing a conductive fluid, wherein a first location of the first pipe is thermally coupled to the housing of the electronic device and a second location of the first pipe is thermally coupled to the first component of the electronic device;
      a magnet configured to generate a magnetic field at a third location of the first pipe;
      a power supply coupled to two first electrodes, the power supply and the first electrodes configured to generate an electrical current through the conductive fluid at the third location of the first pipe, wherein the magnet, power supply, and first electrodes are configured to create a Lorentz force that acts on the conductive fluid at the third location of the first pipe;
      a second pipe containing the conductive fluid, wherein a first location of the second pipe is thermally coupled to the housing of the electronic device and a second location of the second pipe is thermally coupled to the first component of the electronic device; and
      two second electrodes coupled to the power supply, wherein the power supply and two second electrodes are configured to generate a second electrical current through the conductive fluid at a third location of the second pipe.

2. The system of claim 1, wherein the first pipe includes an electrically conductive material coupled to a reference voltage.

3. The system of claim 1, wherein the first component of the electronic device is located at the third location along the first pipe.

4. The system of claim 1, wherein the housing of the electronic device is located at the third location along the first pipe.

5. The system of claim 1, wherein the power supply is configured to supply a direct current (DC) voltage to the two first electrodes.

6. The system of claim 1, wherein:
   the first electrodes are configured to generate a current that creates a Lorentz force in a first direction, and
   the second electrodes are configured to generate a current that creates a Lorentz force in a second direction, opposite the first direction.

7. A cooling system comprising:
   a first pipe containing a conductive fluid, wherein a first location of the first pipe is thermally coupled to a housing of an electronic device and a second location of the first pipe is thermally coupled to a first component of the electronic device;
   a magnet configured to generate a magnetic field at a third location of the first pipe;
   a power supply coupled to two first electrodes, the power supply and the first electrodes configured to generate an electrical current through the conductive fluid at the third location of the first pipe, wherein the magnet, power supply, and first electrodes are configured to create a Lorentz force that acts on the conductive fluid at the third location of the first pipe;
   a second pipe containing the conductive fluid, wherein a first location of the second pipe is thermally coupled to the housing of the electronic device and a second location of the second pipe is thermally coupled to the first component of the electronic device; and
   two second electrodes coupled to the power supply, wherein the power supply and two second electrodes are configured to generate a second electrical current through the conductive fluid at a third location of the second pipe.

8. The cooling system of claim 7, wherein the first pipe includes an electrically conductive material coupled to a reference voltage.

9. The cooling system of claim 7, wherein the first pipe is configured to couple to the first component of the electronic device at the third location along the first pipe.

10. The cooling system of claim 7, wherein the first pipe is configured to couple to the housing of the electronic device at the third location along the first pipe.

11. The cooling system of claim 7, wherein the power supply is configured to supply a direct current (DC) voltage to the two first electrodes.

12. The cooling system of claim 7, wherein:
    the first electrodes are configured to generate a current that creates a Lorentz force in a first direction, and
    the second electrodes are configured to generate a current that creates a Lorentz force in a second direction, opposite the first direction.

13. A system comprising:
    an electronic device, the electronic device including a housing and a first component; and
    a cooling system, the cooling system comprising:
       a pipe containing a fluid;
       a piston housing coupled to the pipe, wherein the first component of the electronic device is thermally coupled to the piston housing of the cooling system;
       a magnetic piston disposed within the piston housing;
       a power supply; and
       an electromagnetic coil coupled to a surface of the piston housing and coupled to the power supply, wherein the power supply and electromagnetic coil are configured to generate a variable magnetic field that causes motion of the piston in the piston housing.

14. The system of claim 13, wherein the power supply is configured to generate an alternating current (AC) signal, the electromagnetic coil is configured to generate an alternating magnetic field, and the piston is configured to move in alternating directions and cause movement of the fluid in alternating directions in the pipe.

15. The system of claim 13, wherein the housing of the electronic device is thermally coupled to the piston housing of the cooling system.

16. The system of claim 13, wherein the electromagnetic coil is a first electromagnetic coil, and the system further comprises:
- a second electromagnetic coil coupled to a surface of the piston housing that is opposite from the surface of the piston housing to which the first electromagnetic coil is coupled, the second electromagnetic coil being coupled to the power supply, wherein the second electromagnetic coil is configured to generate a second magnetic field that causes motion of the piston in the piston housing.

17. The system of claim 16, wherein:
- the first electromagnetic coil is configured to generate the variable magnetic field in a direction that is the same as a direction of the second magnetic field generated by the second electromagnetic coil.

\* \* \* \* \*